(12) United States Patent
Ohkura et al.

(10) Patent No.: US 10,667,379 B2
(45) Date of Patent: May 26, 2020

(54) CONNECTIONS BETWEEN LAMINATED HEATER AND HEATER VOLTAGE INPUTS

(71) Applicant: Lam Research Corporation, Fremont, CA (US)

(72) Inventors: Yuma Ohkura, San Mateo, CA (US); Darrell Ehrlich, San Jose, CA (US); Eric A. Pape, Campbell, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 360 days.

(21) Appl. No.: 15/586,203

(22) Filed: May 3, 2017

(65) Prior Publication Data

US 2017/0332481 A1 Nov. 16, 2017

Related U.S. Application Data

(60) Provisional application No. 62/334,084, filed on May 10, 2016.

(51) Int. Cl.

| | |
|---|---|
| *H05B 3/03* | (2006.01) |
| *H05B 3/06* | (2006.01) |
| *H05B 3/28* | (2006.01) |
| *H05K 1/11* | (2006.01) |
| *H05K 3/10* | (2006.01) |
| *H05K 1/02* | (2006.01) |
| *H05K 1/03* | (2006.01) |
| *H05B 3/26* | (2006.01) |
| *H01L 21/683* | (2006.01) |
| *H01L 21/67* | (2006.01) |

(52) U.S. Cl.
CPC ...... *H05K 1/0212* (2013.01); *H01L 21/67103* (2013.01); *H01L 21/6831* (2013.01); *H05B 3/26* (2013.01); *H05B 3/265* (2013.01); *H05B 3/283* (2013.01); *H05K 1/0306* (2013.01); *H05K 1/112* (2013.01); *H05K 1/113* (2013.01); *H05B 2203/016* (2013.01); *H05B 2203/037* (2013.01)

(58) Field of Classification Search
None
See application file for complete search history.

(56) References Cited

U.S. PATENT DOCUMENTS

| | | | |
|---|---|---|---|
| 7,417,206 B2 * | 8/2008 | Nakamura | H01L 21/67103 219/444.1 |
| 8,546,732 B2 | 10/2013 | Singh | |
| 8,637,794 B2 | 1/2014 | Singh et al. | |
| 8,884,194 B2 * | 11/2014 | Singh | C23C 14/541 219/444.1 |
| 10,049,948 B2 | 8/2018 | Gaff et al. | |

(Continued)

OTHER PUBLICATIONS

U.S. Appl. No. 15/586,178, filed May 3, 2017, Yuma Ohkura et al.

*Primary Examiner* — Joseph M Pelham

(57) ABSTRACT

A substrate support for a substrate processing system includes a plurality of heating zones, a baseplate, a heating layer arranged on the baseplate, a ceramic layer arranged on the heating layer, and wiring provided through the baseplate, the heating layer, and into the ceramic layer in a first zone of the plurality of heating zones. An electrical connection is routed from the wiring in the first zone, across the ceramic layer to a second zone of the plurality of heating zones, and to a heating element in the heating layer in the second zone.

13 Claims, 6 Drawing Sheets

(56) References Cited

U.S. PATENT DOCUMENTS

| | | | |
|---|---|---|---|
| 2006/0096972 A1* | 5/2006 | Nakamura | H01L 21/67103 219/444.1 |
| 2010/0116788 A1* | 5/2010 | Singh | C23C 16/4586 216/66 |
| 2011/0092072 A1* | 4/2011 | Singh | C23C 14/541 438/710 |
| 2012/0115254 A1* | 5/2012 | Singh | H01L 21/67109 438/5 |
| 2014/0154819 A1* | 6/2014 | Gaff | H01L 21/67109 438/17 |
| 2017/0229327 A1* | 8/2017 | Singh | C23C 14/541 |
| 2019/0159291 A1* | 5/2019 | Ptasienski | C23C 16/4586 |

\* cited by examiner

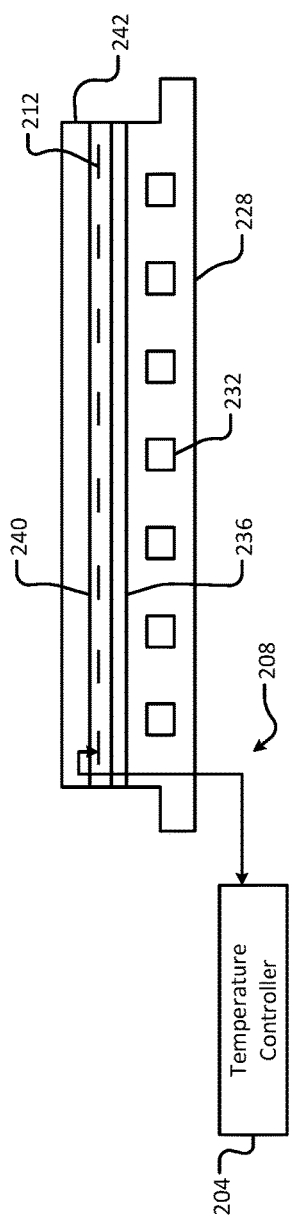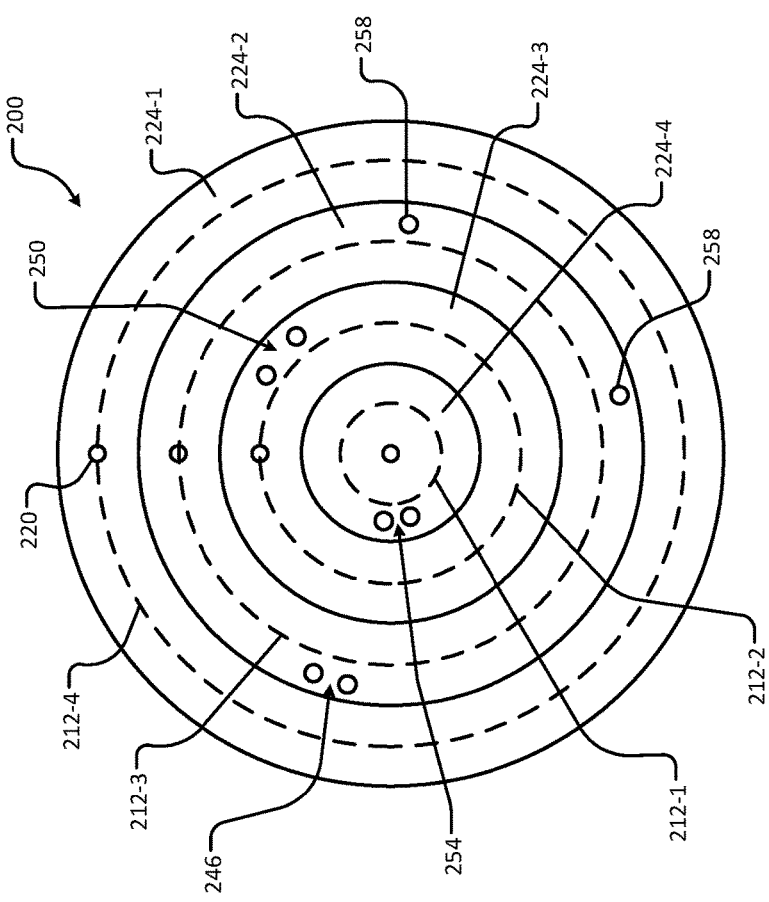

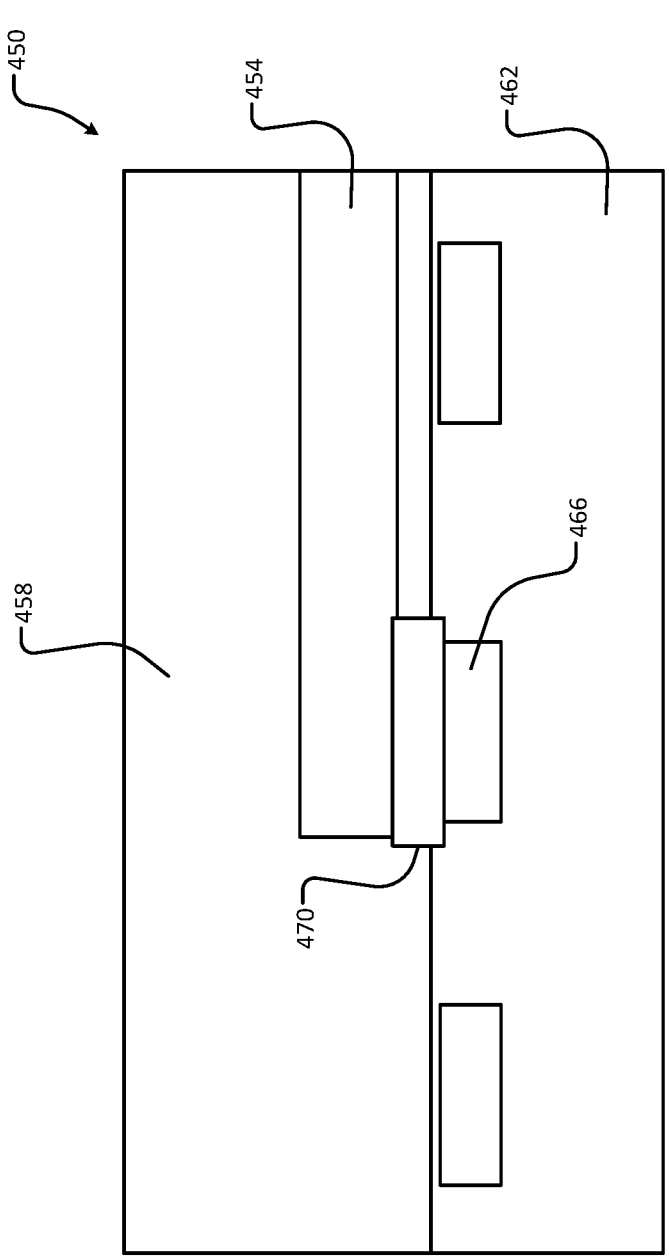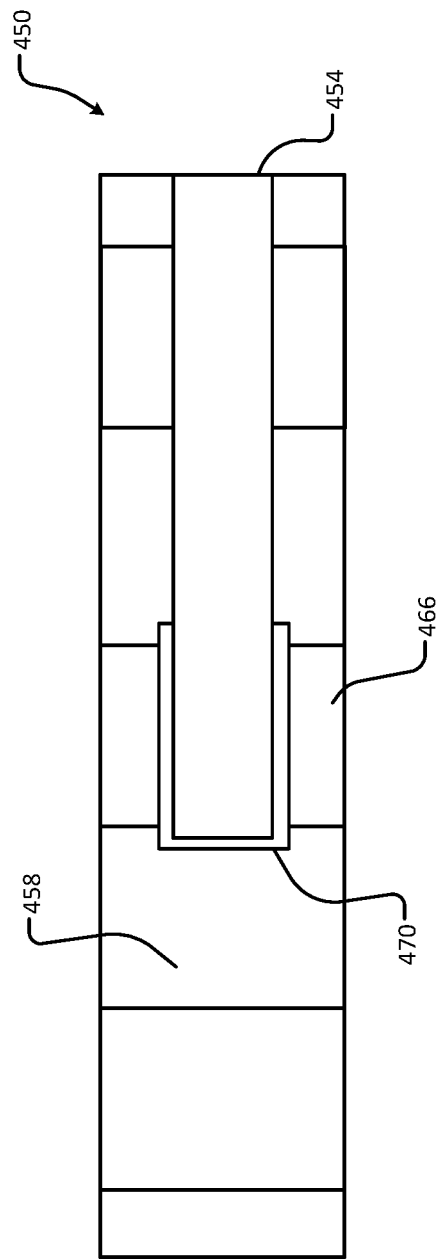
FIG. 4A
FIG. 4B

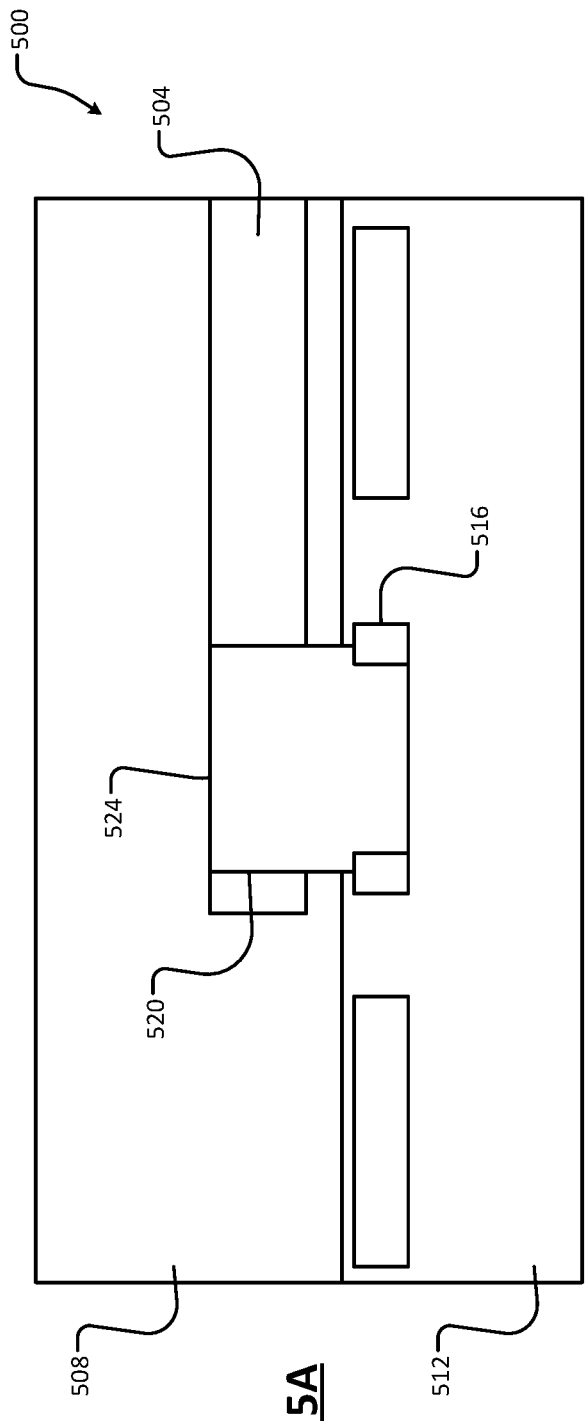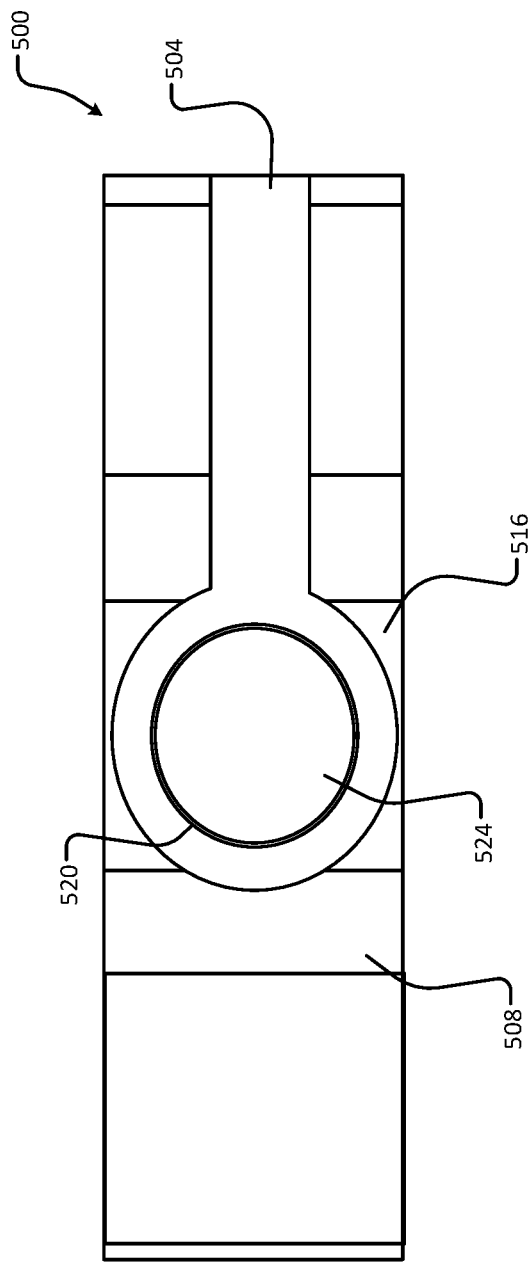

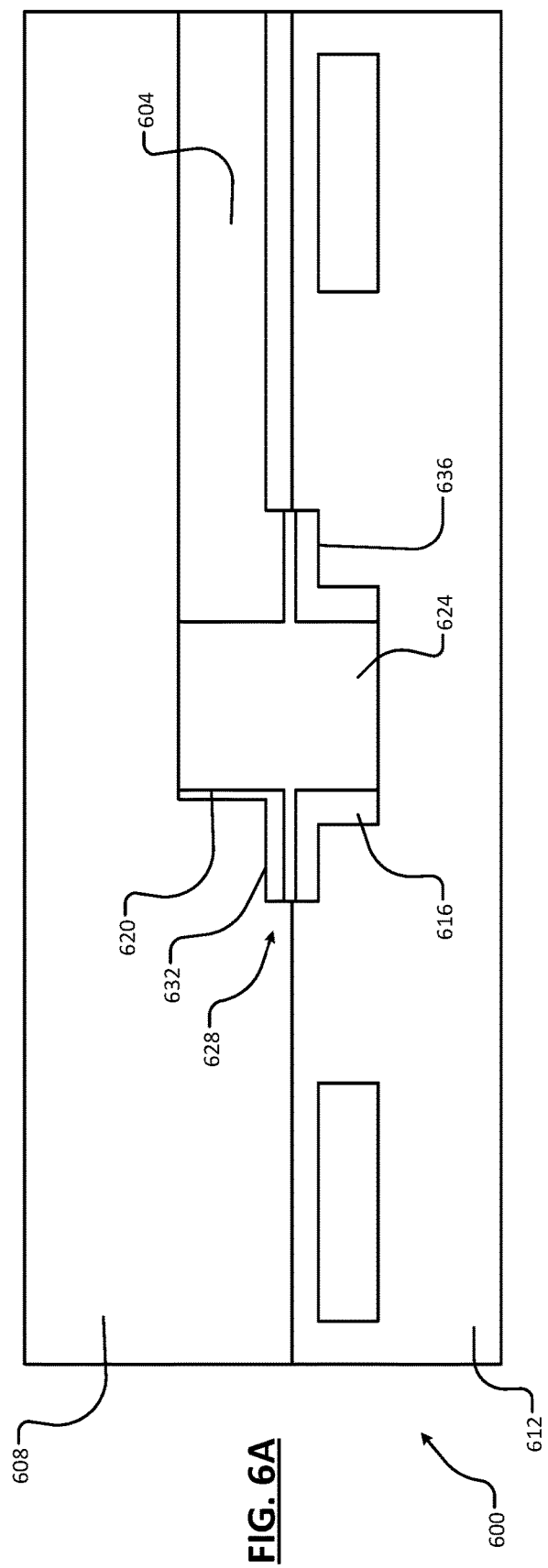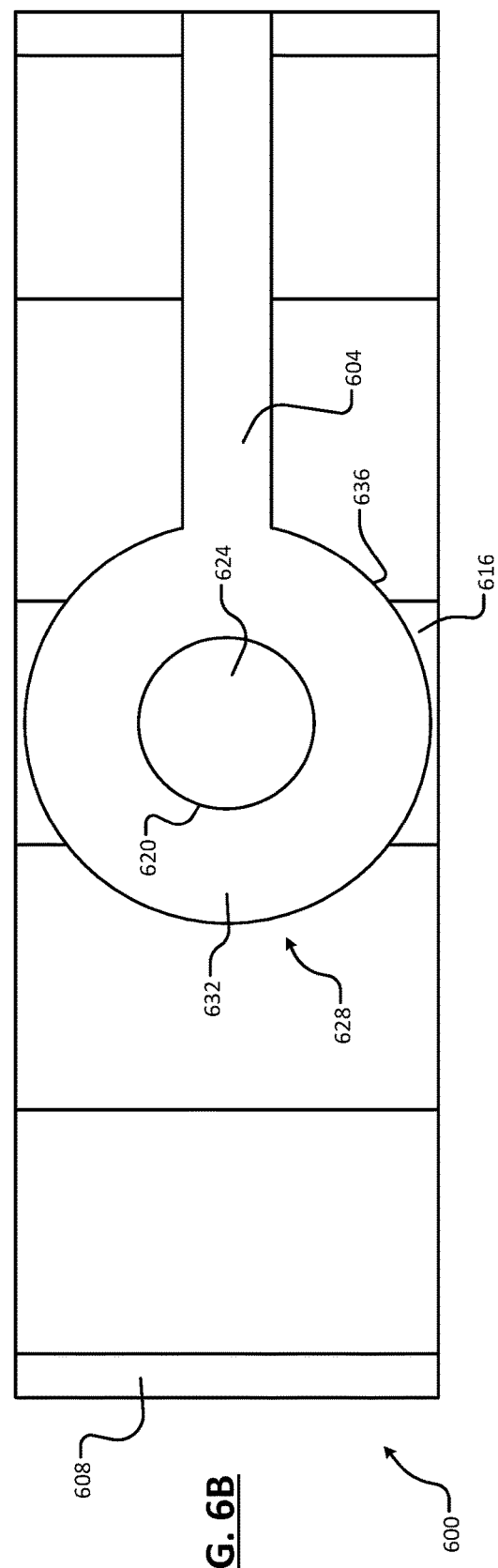

CONNECTIONS BETWEEN LAMINATED HEATER AND HEATER VOLTAGE INPUTS

CROSS-REFERENCE TO RELATED APPLICATIONS

This application claims the benefit of U.S. Provisional Application No. 62/334,097, filed on May 10, 2016 and U.S. Provisional Application No. 62/334,084, filed on May 10, 2016.

The present application is related to U.S. patent application Ser. No. 15/586,178 filed on May 3, 2017. The entire disclosures of the applications referenced above are incorporated herein by reference.

FIELD

The present disclosure relates to substrate processing systems, and more particularly to systems and methods for controlling substrate support temperature.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to treat substrates such as semiconductor wafers. Example processes that may be performed on a substrate include, but are not limited to, chemical vapor deposition (CVD), atomic layer deposition (ALD), conductor etch, and/or other etch, deposition, or cleaning processes. A substrate may be arranged on a substrate support, such as a pedestal, an electrostatic chuck (ESC), etc. in a processing chamber of the substrate processing system. During etching, gas mixtures including one or more precursors may be introduced into the processing chamber and plasma may be used to initiate chemical reactions.

A substrate support such as an ESC may include a ceramic layer arranged to support a substrate. For example, the substrate may be clamped to the ceramic layer during processing. A heating layer may be arranged between the ceramic layer and a baseplate of the substrate support. For example only, the heating layer may be a ceramic heating plate including heating elements, wiring, etc. The temperature of the substrate may be controlled during process steps by controlling the temperature of the heating plate.

SUMMARY

A substrate support for a substrate processing system includes a plurality of heating zones, a baseplate, a heating layer arranged on the baseplate, a ceramic layer arranged on the heating layer, and wiring provided through the baseplate, the heating layer, and into the ceramic layer in a first zone of the plurality of heating zones. An electrical connection is routed from the wiring in the first zone, across the ceramic layer to a second zone of the plurality of heating zones, and to a heating element in the heating layer in the second zone.

In other features, the electrical connection corresponds to an electrical trace. The electrical connection corresponds to second wiring different from the wiring provided through the baseplate. The second zone is located radially outward of the first zone. The electrical connection has a lower electrical resistance than the heating element.

In other features, the substrate support includes a via provided through the baseplate, the heating layer, and the ceramic layer in the first zone, and the wiring is routed through the via. The electrical connection is coupled to a connection point of the heating element using at least one of a solder connection and conductive epoxy.

In still other features, the substrate support includes a via provided through the ceramic layer and the heating layer in the second zone. The via is filled with a conductive material coupling the electrical connection to a connection point of the heating element. The substrate support includes a contact pad arranged between the electrical connection and the heating element. The contact pad includes a first portion arranged in the ceramic layer and a second portion arranged in the heating layer. The via is filled with a conductive material. The conductive material is provided between the first portion of the contact pad and the second portion of the contact pad.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 2A is an example electrostatic chuck according to the principles of the present disclosure;

FIG. 2B illustrates zones and thermal control elements of an example electrostatic chuck according to the principles of the present disclosure;

FIGS. 4A and 4B illustrate a first example connection between a ceramic layer and a heating layer according to the principles of the present disclosure;

FIGS. 5A and 5B illustrate a second example connection between a ceramic layer and a heating layer according to the principles of the present disclosure; and FIGS. 6A and 6B illustrate a third example connection between a ceramic layer and a heating layer according to the principles of the present disclosure.

In the drawings, reference numbers may be reused to identify similar and/or identical elements.

DETAILED DESCRIPTION

Figure 1:
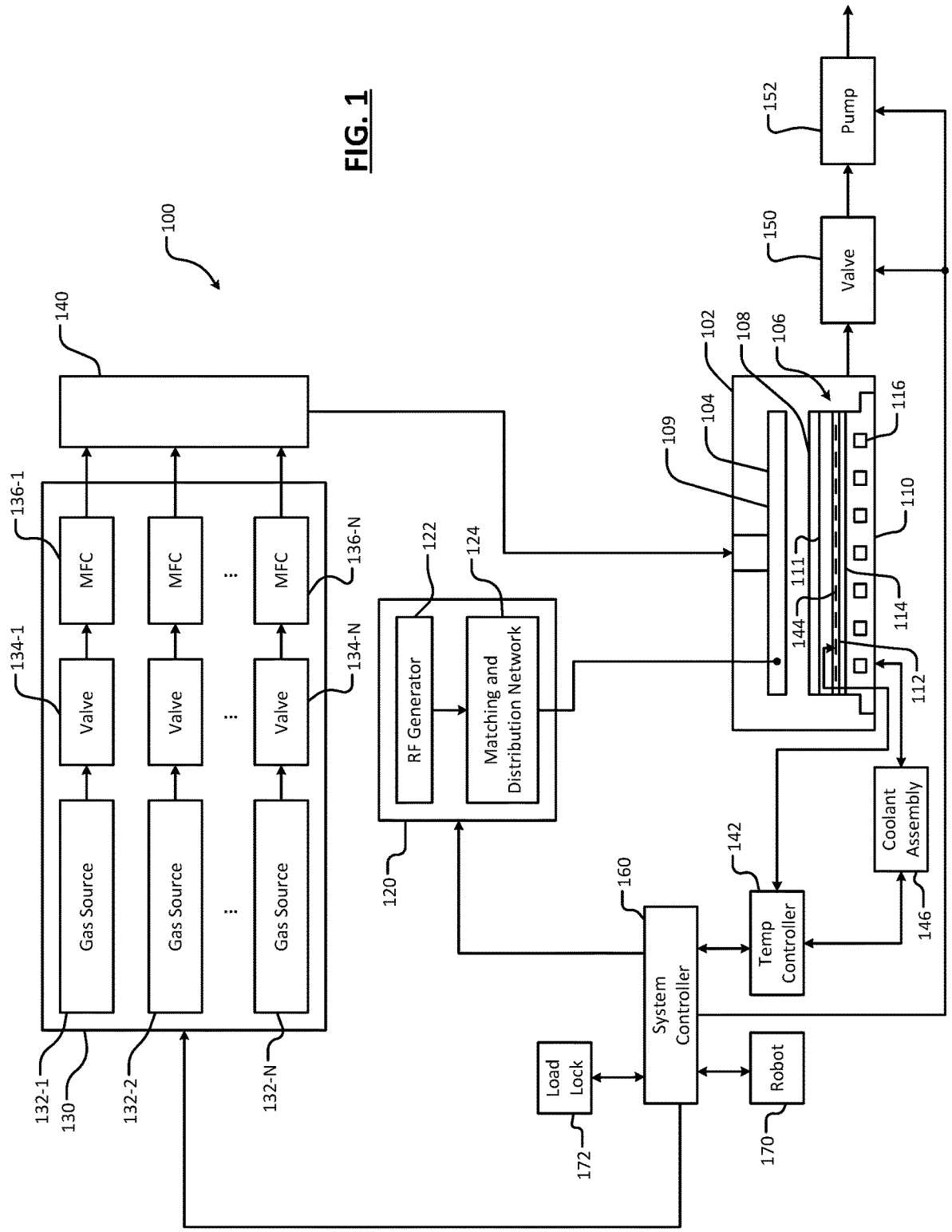
FIG. 1 is a functional block diagram of an example substrate processing system including a substrate support according to the principles of the present disclosure.

A substrate support such as an electrostatic chuck (ESC) may include one or multiple heating zones (e.g., a multi-zone ESC). The ESC may include respective heating elements for each zone of a heating layer. The heating elements are controlled to roughly achieve a desired setpoint temperature in each of the respective zones.

The heating layer may comprise a laminated heating plate arranged between an upper ceramic layer of the substrate support and a baseplate. The heating plate includes a plurality of heating elements arranged throughout the zones of the ESC. The heating elements include electrical traces or other wiring that receive voltage inputs provided from a voltage source below the ESC through the baseplate. For example, the baseplate may include one or more vias (e.g., holes or access ports) aligned with connection points of the heating elements in the heating plate. Wiring is connected between the voltage source and the connection points of the heating elements through the vias in the baseplate.

Typically, it is desirable for the vias and the wiring routed through the vias to be as close as possible to the corresponding connection points of the heating elements to avoid heater exclusion zones (i.e., zones where heating elements cannot be located) and reduce temperature non-uniformities. For example, the vias may be located directly below the connection points. However, in some ESCs, various structural features may interfere with providing vias, wiring, and other heating element components in the most desirable locations. Consequently, the vias and corresponding wiring may be located further apart, and/or may be located outside of a destination zone of the ESC. For example, in an ESC having an inner zone, a mid-inner zone, a mid-outer zone, and an outer zone, vias and wiring for the outer zone may be located under the mid-outer zone, resulting in a non-symmetrical heating pattern and temperature non-uniformities.

Systems and methods according to the principles of the present disclosure provide connections between the voltage inputs and the heating plate through the ceramic layer above the heating plate. In other words, wiring is provided upward through vias in the baseplate and the heating layer and into the ceramic layer. Within the ceramic layer, the wiring, which may include electrical traces, contacts, etc., is routed horizontally (i.e., transverse) toward the desired connection point of the heating layer, and then downward back into the heating layer at the desired connection point. Accordingly, the electrical connections between the vias and the respective connection points are embedded within the ceramic layer, and it is not necessary to minimize distances between the vias and wiring for the voltage inputs and the connection points. In this manner, routing electrical connections through the ceramic layer improves design flexibility (e.g., locations of vias), reduces heater exclusion zones, and improves temperature uniformity across the ESC.

Referring now to FIG. 1, an example substrate processing system 100 is shown. For example only, the substrate processing system 100 may be used for performing etching using RF plasma and/or other suitable substrate processing. The substrate processing system 100 includes a substrate processing chamber 102 that encloses other components of the substrate processing chamber 102 and contains the RF plasma. The substrate processing chamber 102 includes an upper electrode 104 and a substrate support 106, such as an electrostatic chuck (ESC). During operation, a substrate 108 is arranged on the substrate support 106. While a specific substrate processing system 100 and chamber 102 are shown as an example, the principles of the present disclosure may be applied to other types of substrate processing systems and chambers, such as a substrate processing system that generates plasma in-situ, that implements remote plasma generation and delivery (e.g., using a microwave tube), etc.

For example only, the upper electrode 104 may include a showerhead 109 that introduces and distributes process gases. The showerhead 109 may include a stem portion including one end connected to a top surface of the processing chamber. A base portion is generally cylindrical and extends radially outwardly from an opposite end of the stem portion at a location that is spaced from the top surface of the processing chamber. A substrate-facing surface or faceplate of the base portion of the showerhead includes a plurality of holes through which process gas or purge gas flows. Alternately, the upper electrode 104 may include a conducting plate and the process gases may be introduced in another manner.

The substrate support 106 includes a conductive baseplate 110 that acts as a lower electrode. The baseplate 110 supports a ceramic layer 111, and a heating plate 112 is arranged between the baseplate 110 and the ceramic layer 111. For example only, the heating plate 112 may correspond to a laminated, multi-zone heating plate. A thermal resistance layer 114 (e.g., a bond layer) may be arranged between the heating plate 112 and the baseplate 110. The baseplate 110 may include one or more coolant channels 116 for flowing coolant through the baseplate 110.

An RF generating system 120 generates and outputs an RF voltage to one of the upper electrode 104 and the lower electrode (e.g., the baseplate 110 of the substrate support 106). The other one of the upper electrode 104 and the baseplate 110 may be DC grounded, AC grounded or floating. For example only, the RF generating system 120 may include an RF voltage generator 122 that generates the RF voltage that is fed by a matching and distribution network 124 to the upper electrode 104 or the baseplate 110. In other examples, the plasma may be generated inductively or remotely. Although, as shown for example purposes, the RF generating system 120 corresponds to a capacitively coupled plasma (CCP) system, the principles of the present disclosure may also be implemented in other suitable systems, such as, for example only transformer coupled plasma (TCP) systems, CCP cathode systems, remote microwave plasma generation and delivery systems, etc.

A gas delivery system 130 includes one or more gas sources 132-1, 132-2, . . . , and 132-N (collectively gas sources 132), where N is an integer greater than zero. The gas sources supply one or more precursors and mixtures thereof. The gas sources may also supply purge gas. Vaporized precursor may also be used. The gas sources 132 are connected by valves 134-1, 134-2, . . . , and 134-N (collectively valves 134) and mass flow controllers 136-1, 136-2, . . . , and 136-N (collectively mass flow controllers 136) to a manifold 140. An output of the manifold 140 is fed to the processing chamber 102. For example only, the output of the manifold 140 is fed to the showerhead 109.

A temperature controller 142 may provide voltage inputs to a plurality of heating elements 144 arranged in the heating plate 112. For example, the heating elements 144 may include, but are not limited to, heating elements corresponding to respective zones in a multi-zone heating plate and/or an array of micro heating elements disposed across multiple zones of a multi-zone heating plate. The temperature controller 142 may be used to control the plurality of heating elements 144 to control a temperature of the substrate support 106 and the substrate 108. The substrate support 106 according to the principles of the present disclosure routes electrical connections for the heating elements 144 through the ceramic layer 111 as described below in more detail.

The temperature controller 142 may communicate with a coolant assembly 146 to control coolant flow through the channels 116. For example, the coolant assembly 146 may include a coolant pump and reservoir. The temperature controller 142 operates the coolant assembly 146 to selectively flow the coolant through the channels 116 to cool the substrate support 106.

A valve 150 and pump 152 may be used to evacuate reactants from the processing chamber 102. A system controller 160 may be used to control components of the substrate processing system 100. A robot 170 may be used to deliver substrates onto, and remove substrates from, the substrate support 106. For example, the robot 170 may transfer substrates between the substrate support 106 and a load lock 172. Although shown as separate controllers, the temperature controller 142 may be implemented within the system controller 160.

Referring now to FIGS. 2A and 2B, an example ESC 200 is shown. A temperature controller 204 communicates with the ESC 200 via one or more electrical connections 208. For example, the electrical connections 208 may include, but are not limited to, connections for selectively controlling heating elements 212-1, 212-2, 212-3, and 212-4, referred to collectively as heating elements 212, and connections for receiving temperature feedback from one or more zone temperature sensors 220.

As shown, the ESC 200 is a multi-zone ESC including zones 224-1, 224-2, 224-3, and 224-4, referred to collectively as zones 224, which may be referred to as an outer zone, a mid-outer zone, a mid-inner zone, and an inner zone, respectively. The outer zone may correspond to an outermost zone. Although shown with the four concentric zones 224, in embodiments the ESC 200 may include one, two, three, or more than four of the zones 224. The shapes of the zones 224 may vary. For example, the zones 224 may be provided as quadrants or another grid-like arrangement. Each of the zones 224 includes, for example only, a respective one of the zone temperature sensors 220 and a respective one of the heating elements 212. In embodiments, each of the zones 224 may have more than one of the temperature sensors 220.

The ESC 200 includes a baseplate 228 including coolant channels 232, a thermal resistance layer 236 formed on the baseplate 228, a multi-zone ceramic heating plate 240 formed on the thermal resistance layer 236, and an upper ceramic layer 242 formed on the heating plate 240. Voltage inputs are provided from the temperature controller 204 to the heating elements 212 using wiring routed through the baseplate 228 and the ceramic layer 242.

The temperature controller 204 controls the heating elements 212 according to a desired setpoint temperature. For example, the temperature controller 204 may receive (e.g., from the system controller 160 as shown in FIG. 1) a setpoint temperature for one or more of the zones 224. For example only, the temperature controller 204 may receive a same setpoint temperature for all or some of the zones 224 and/or different respective setpoint temperatures for each of the zones 224. The setpoint temperatures for each of the zones 224 may vary across different processes and different steps of each process.

The temperature controller 204 controls the heating elements 212 for each of the zones 224 based on the respective setpoint temperatures and temperature feedback provided by the sensors 220. For example, the temperature controller 204 individually adjusts power (e.g., current or duty cycle) provided to each of the heating elements 212 to achieve the setpoint temperatures at each of the sensors 220. The heating elements 212 may each include a single resistive coil or other structure schematically represented by the dashed lines of FIG. 2B. Accordingly, adjusting one of the heating elements 212 affects the temperature of the entire respective zone 224, and may also affect other ones of the zones 224. The sensors 220 may provide temperature feedback for only a local portion of each of the zones 224. For example only, the sensors 220 may be positioned in a portion of each zone 224 previously determined to have the closest correlation to the average temperature of the zone 224.

As shown, respective vias 246, 250, and 254 and corresponding voltage inputs are provided in the mid-outer zone 224-2, the mid-inner zone 224-3, and the inner zone 224-4. As used herein, "vias" generally refers to openings, ports, etc. through a structure such as the baseplate 228, whereas "wiring" refers to conductive material within the vias. Although the vias are shown in pairs in a particular location for example only, any suitable locations and/or number of vias may be implemented. For example, the vias 246, 250, and 254 are provided through a baseplate 228 and wiring is provided through the vias 246, 250, and 254 to respective connections points. However, vias 258 corresponding to the outer zone 224-1 may be located further apart than the vias 246, 250, and 254, and may be located in the mid-outer zone 224-2. In other words, wiring for heating elements of the outer zone 224-1 is not provided directly under the outer zone 224-1. Accordingly, additional electrical connections are required to provide voltage inputs to the heating elements of the outer zone 224-1.

Figure 3:
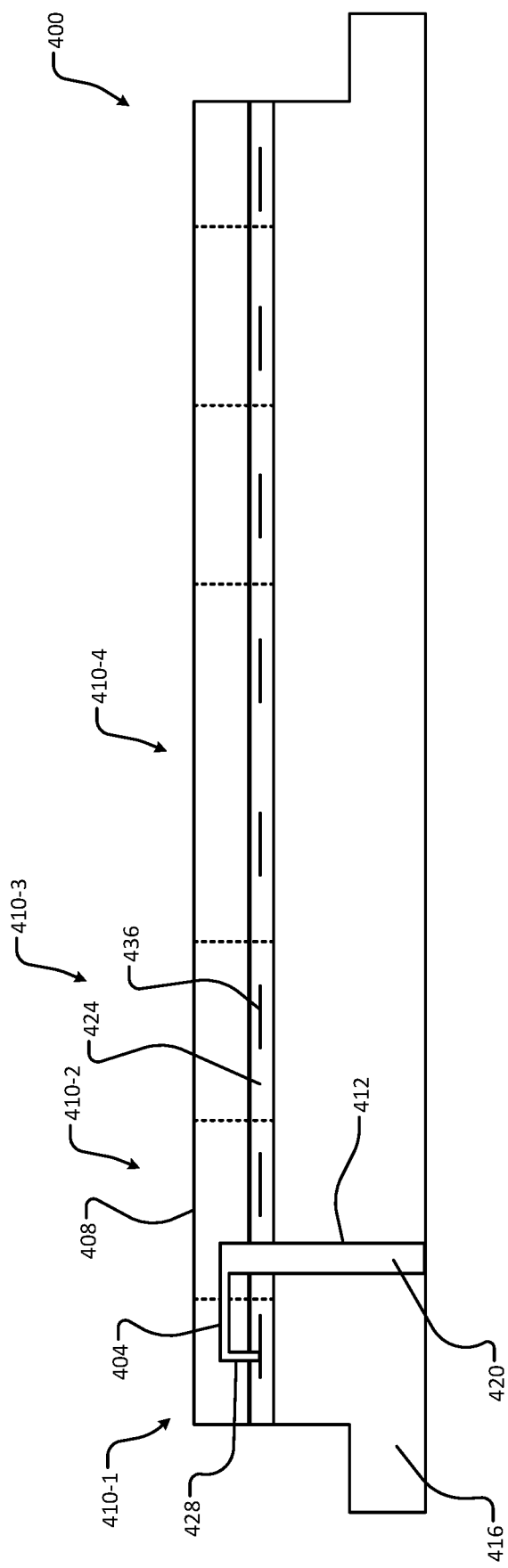
FIG. 3 illustrates example routing of electrical connections through a ceramic layer of an electrostatic chuck according to the principles of the present disclosure.

FIG. 3 shows an example ESC 400 having electrical connections 404 routed within (e.g., traversing, in a lateral direction) a ceramic layer 408. Although the ceramic layer 408 is shown as a single uniform layer, in some examples the ceramic layer 408 may correspond to a plurality of discrete layers, one layer of a plurality of layers, etc. The ESC 400 has a plurality of zones including, for example only, an outer zone 410-1 (e.g., corresponding to a radially outermost zone of the ESC 400), a mid-outer zone 410-2, a mid-inner zone 410-3, and an inner zone 410-4, which may be referred to collectively as zones 410. For example, a via 412 in a baseplate 416 may be located outside of the outer zone 410-1 (e.g., in the mid-outer zone 410-2) of the ESC 400 as described above in FIGS. 2A and 2B. A voltage input (e.g., wiring) 420 is routed through the via 412 and heating layer 424 and into the ceramic layer 408. Within the ceramic layer 408, the electrical connections 404 are routed across the ceramic layer 408 toward a connection point 428 in the heating layer 424. Accordingly, the voltage input to the heating layer 424 in the outer zone 410-1 of the ESC is provided through the baseplate 416 and the ceramic layer 408. In some examples, the electrical connections 404 correspond to electrical traces. In other examples, the electrical connections 404 comprise wiring. For example, the wiring of the electrical connections 404 may be the same as or different from wiring of the voltage input 420.

The electrical connections 404 within the ceramic layer 408 may comprise a conductive material and/or dimensions having a low electrical resistance (e.g., relative to heating elements 436 of the heating layer 424). For example only, the electrical connections 404 may include, but are not limited to, tungsten, copper, magnesium, palladium, silver, and/or various alloys thereof. Conversely, the heating elements 436 may comprise, but are not limited to, nickel alloy, iron alloy, tungsten alloy, etc. The heating layer 424 may comprise polyimide, acrylic, silicone, etc. with the heating elements 436 embedded therein.

Although as shown the via 412 is located in the mid-outer zone 410-2 and the electrical connections 404 are routed from the mid-outer zone 410-2 across the ceramic layer 408 to the outer zone 410-1, in other examples the via 412 may be located in any one of the zones 410 and the electrical connections 404 may be routed to any one of the other zones 410. In some examples, the electrical connections 404 are routed across multiple ones of the zones 410 (e.g., from a via located in the mid-inner zone 410-3 to the outer zone 410-1). Further, although as shown the electrical connections 404 are routed from a via in a radially inward zone to a radially outward zone, in other examples the electrical connections 404 are routed from a via in a radially outward zone to a radially inward zone (e.g., from a via located in the outer zone 410-1 to the mid-inner zone 410-3).

Referring now to FIGS. 4A and 4B, a first example arrangement of an ESC 450 according to the principles of the present disclosure is shown. FIG. 4A is a cross-section view and FIG. 4B is a plan view. In this example, an electrical connection 454 (e.g., corresponding to the electrical connection 404) is routed through a ceramic layer 458 formed on a heating layer 462. For example, the electrical connection 454 is routed from a mid-outer zone to an outer zone of the ESC 450. The electrical connection 454 is electrically coupled to a connection point of a heating element 466 using conductive material 470 (e.g., solder, conductive epoxy, etc.).

Referring now to FIGS. 5A and 5B, a second example arrangement of an ESC 500 according to the principles of the present disclosure is shown. FIG. 5A is a cross-section view and FIG. 5B is a plan view. In this example, an electrical connection 504 is routed through a ceramic layer 508 formed on a heating layer 512. For example, the electrical connection 504 is routed from a mid-outer zone to an outer zone of the ESC 500. The electrical connection 504 is electrically coupled to a connection point of a heating element 516 using a via 520 filled with conductive material 524 (e.g., solder, conductive epoxy, etc.). For example, the via 520 may be formed through corresponding regions of the electrical connection 504, the ceramic layer 508, the heating layer 512, and the heating element 516 and then filled with the conductive material 524.

Referring now to FIGS. 6A and 6B, a third example arrangement of an ESC 600 according to the principles of the present disclosure is shown. FIG. 6A is a cross-section view and FIG. 6B is a plan view. In this example, an electrical connection 604 is routed through a ceramic layer 608 formed on a heating layer 612. For example, the electrical connection 604 is routed from a mid-outer zone to an outer zone of the ESC 600. The electrical connection 604 is electrically coupled to a connection point of a heating element 616 using a via 620 filled with conductive material 624 (e.g., solder, conductive epoxy, etc.) and a contact pad 628 arranged between the electrical connection 604 and the heating element 616. For example, the via 620 may be formed through corresponding regions of the electrical connection 604, the ceramic layer 608, the heating layer 612, the heating element 616, and the contact pad 628 and then filled with the conductive material 624.

As shown, the conductive material 624 may be provided between separate portions of the contact pad 628 (i.e., between a portion 632 of the contact pad 628 coupled to the electrical connection 604 and a portion 636 of the contact pad 628 coupled to the heating element 616). Portions 632 and 636 of the contact pad 628 may comprise the same or different materials. For example, the portion 632 may comprise the same material as the electrical connection 604 while the portion 636 comprises the same material as the heating element 616. In other examples, the contact pad 628 may correspond to a single structure coupled to both the electrical connection 604 and the heating element 616 with the via 620 formed therethrough.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a substrate pedestal, a gas flow system, etc.). These systems may be integrated with electronics for controlling their operation before, during, and after processing of a semiconductor substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, substrate transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor substrate or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a substrate.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the substrate processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor substrates.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of substrates to and from tool locations and/or load ports in a semiconductor manufacturing factory.

What is claimed is:

1. A substrate support for a substrate processing system, the substrate support comprising:
    a plurality of heating zones;
    a baseplate;
    a heating layer arranged on the baseplate;
    a ceramic layer arranged on the heating layer;
    wiring provided through the baseplate, the heating layer, and into the ceramic layer in a first zone of the plurality of heating zones;
    an electrical connection routed from the wiring in the first zone, across the ceramic layer to a second zone of the plurality of heating zones, and to a heating element in the heating layer in the second zone.

2. The substrate support of claim 1, wherein the electrical connection corresponds to an electrical trace.

3. The substrate support of claim 1, wherein the electrical connection corresponds to second wiring different from the wiring provided through the baseplate.

4. The substrate support of claim 1, wherein the second zone is located radially outward of the first zone.

5. The substrate support of claim 1, further comprising a via provided through the baseplate, the heating layer, and the ceramic layer in the first zone, wherein the wiring is routed through the via.

6. The substrate support of claim 1, wherein the electrical connection has a lower electrical resistance than the heating element.

7. The substrate support of claim 1, wherein the electrical connection is coupled to a connection point of the heating element using at least one of a solder connection and conductive epoxy.

8. The substrate support of claim 1, further comprising a via provided through the ceramic layer and the heating layer in the second zone.

9. The substrate support of claim 8, wherein the via is filled with a conductive material coupling the electrical connection to a connection point of the heating element.

10. The substrate support of claim 8, further comprising a contact pad arranged between the electrical connection and the heating element.

11. The substrate support of claim 10, wherein the contact pad includes a first portion arranged in the ceramic layer and a second portion arranged in the heating layer.

12. The substrate support of claim 11, wherein the via is filled with a conductive material.

13. The substrate support of claim 12, wherein the conductive material is provided between the first portion of the contact pad and the second portion of the contact pad.

* * * * *